United States Patent [19]

Kovacs et al.

[11] 4,029,536

[45] June 14, 1977

[54] METHODS OF AND APPARATUS FOR MOUNTING ARTICLES TO A CARRIER MEMBER

[75] Inventors: Ernest Kovacs, Allentown; David P. Ludwig; Friedrich Zwickel, both of Whitehall, all of Pa.

[73] Assignee: Western Electric Company, Inc., New York, N.Y.

[22] Filed: Apr. 7, 1976

[21] Appl. No.: 674,336

[52] U.S. Cl. .............................. 156/285; 156/297; 156/552; 156/578

[51] Int. Cl.[2] ................. B29C 17/00; B32B 31/00; B65C 11/04

[58] Field of Search .......... 156/285, 297, 547, 548, 156/552, 578

[56] References Cited

UNITED STATES PATENTS

| | | | |
|---|---|---|---|
| 3,743,558 | 7/1973 | Ludwig | 156/552 |
| 3,785,903 | 1/1974 | Boyer et al. | 156/356 |
| 3,834,966 | 9/1974 | Kelly | 156/297 |
| 3,855,034 | 12/1974 | Miller | 156/297 |
| 3,871,936 | 3/1975 | Boyer et al. | 156/238 |
| 3,982,979 | 9/1976 | Hentz | 156/285 |

*Primary Examiner*—Douglas J. Drummond
*Attorney, Agent, or Firm*—W. O. Schellin

[57] ABSTRACT

An apparatus aligns small articles, such as semiconductor chips, to a reference axis and loads them on predetermined sites of a carrier, such as a tape. The loading requires precisely positioning adhesive dots and the articles at the sites of the tape. Precision within desired limits is achieved by aligning both an applicator for applying the adhesive and the articles in sequence to a common centerline. The tape is maintained in contact with two diametrically opposed locations of an index wheel located on the common centerline. The index wheel is then reciprocated along the centerline to alternately apply adhesive to one of the sites on the tape and then load the aligned article to another one of the sites. An additional article is aligned to the centerline each time loading is completed of a previously aligned article to its respective site. The aligning facility is operated by a cam which controls the vertical position of a plunger and acts as a valving means for selective vacuum and air purge applications.

16 Claims, 8 Drawing Figures

METHODS OF AND APPARATUS FOR MOUNTING ARTICLES TO A CARRIER MEMBER

BACKGROUND OF THE INVENTION

1. Field of the Invention

This invention relates to methods of and apparatus for mounting articles to a carrier member. More particularly, another aspect of the invention relates to handling small articles, such as beam-lead integrated circuit chips, prior to bonding the chips to the substrates. Adhesive dots are applied around the periphery of apertures in a tape. The size and shape of each of the apertures are chosen to form pockets for the chips. The chips then are loaded from an expanded array into the pockets of the tape, suspended by at least some of the beams attached by the adhesive dots to the periphery of these pockets. Thereafter, the tape is run onto a spool to store the loaded chips for future bonding of the chips onto substrates. The bonding is accomplished during a transfer of the chips directly from the tape to the substrate. Bonds are preferably formed by a thermocompression process, wherein the tape serves as a compliant member between the chips and a thermode applying the thermocompressive energy.

2. Description of the Prior Art

U.S. Pat. No. 3,785,903 and 3,871,936 to J.A. Boyer, D.P. Ludwig and F. Zwickel issued Jan. 15, 1974, disclose prior art apparatus and methods, respectively, which relate to the subject matter of the present invention. The Boyer et al. patents also make reference to other prior art patents which relate to beam-lead semiconductor devices, compliant bonding and other related subject matter.

The Boyer et al. patents particularly disclose apparatus and methods for loading beam-lead chips into preselected locations of a compliant tape. The compliant tape can then be supplied to a bonder, the beam-lead chips being already loaded in the tape and aligned for sequential bonding to respective substrates.

A load station of the apparatus disclosed by Boyer et al. includes facilities for first indexing one of the preselected locations into rough alignment with the load station. Thereafter, other facilities precisely align such locations. The disclosed apparatus further includes facilities for applying a plurality of dots of adhesive to the tape. The adhesive dots are applied prior to loading the chips to the tape. The dots form a pattern about the periphery of each of the locations on the tape. The pattern is intended to be coincident with selected leads of the chips to be loaded. Successive locations of the tape are first indexed into at least rough alignment with the applying facilities. Indexing the tape shifts other locations away from the applying facilities and toward the load station. After the tape is indexed, roughly aligned locations are precisely aligned to both the applying facilities and to the loading station so that the applying facilities can be simultaneously activated with the facilities for loading one of the chips.

It is desirable to integrate and simplify the alignment of preselected locations or sites on a length of tape with respect to a chip load station.

SUMMARY OF THE INVENTION

Therefore, an object of the invention is to provide new and improved methods of and apparatus for mounting articles to a carrier tape.

Another object of the invention is to provide efficient handling to repetitively align successive chips to a preselected position in preparation for loading them onto the tape.

Still another object of the invention is to achieve a high degree of repetitive accuracy in loading the chips onto the tape, the accuracy being commensurate with extremely small beam lead sizes of integrated circuit chips presently known in the art.

These objects are accomplished by engaging a portion of the tape with a locating means; moving a site in the engaged portion against an adhesive applicator; maintaining the engagement of the tape while indexing the site into alignment with a chip and then moving the site toward and against the chip without releasing the portion from engagement with the locating means.

In another aspect of the invention the chip is precisely located and oriented with respect to a predetermined centerline. A centering mechanism is activated by a combination cam to (1) selectively raise and lower a pedestal, and (2) control a selective application of a vacuum between the pedestal and the chip. The cam has a contoured surface for moving a plunger terminating in the pedestal in a predetermined manner and further includes at least one fluid duct section positioned in a planar surface of the cam to selectively couple a fluid port in the pedestal to a fluid circuit in response to a relative movement between the plunger and the cam, whereby a vacuum or fluid flow is selectively applied at the fluid port of the pedestal.

BRIEF DESCRIPTION OF THE DRAWINGS

Other advantages and features of the present invention will be more readily understood from the following detailed description in reference to the accompanying drawing, in which.

DETAILED DESCRIPTION

The Apparatus in General

Figure 1:
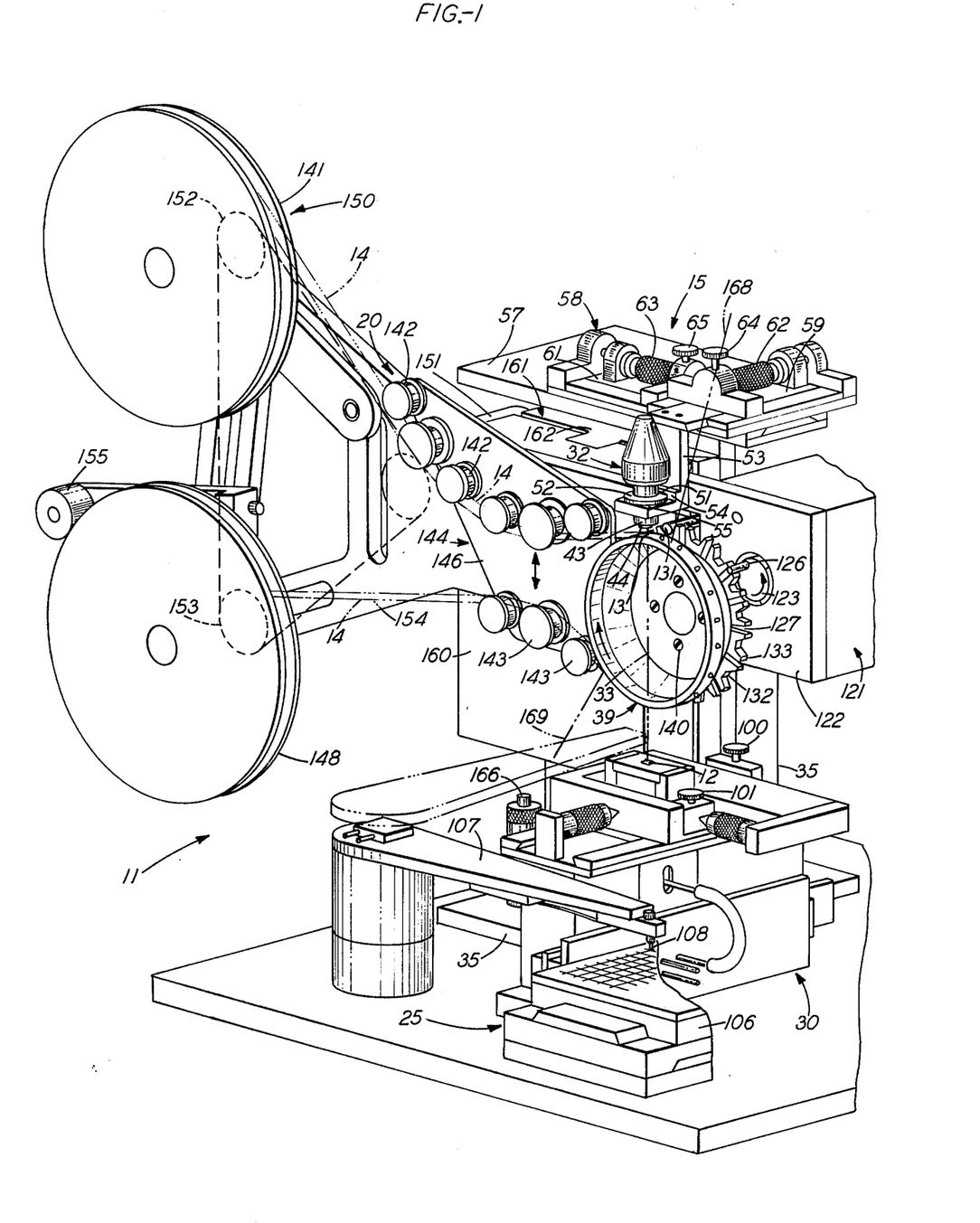
FIG. 1 is a pictorial representation of a chip loading apparatus which incorporates the present invention.
Figure 2:
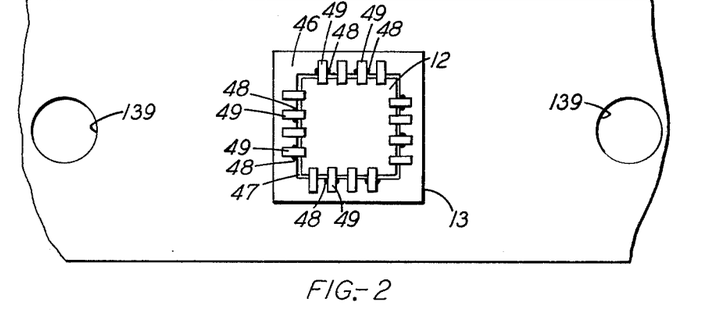
FIG. 2 is a portion of a compliant tape, showing conventional locating apertures in the tape and a site where a chip is held by a pattern of applied dots of adhesive.

Illustrated in FIG. 1 is an apparatus designated generally by the numeral 11, for precisely orienting and loading articles, such as beam-lead semiconductor chips 12 (FIG. 2) onto designated locations or sites 13 of a tape 14. The tape 14, a portion of which is shown in FIG. 2, is used in the semiconductor industry for compliantly bonding the beam lead chips 12 to a substrate (not shown). Referring back to FIG. 1, the apparatus 11 includes such major assemblies as an adhesive applicator unit 15, a tape transport and alignment unit 20, a chip supply unit 25, and a chip locating unit 30.

In the apparatus 11, an adhesive applicator 32 of the adhesive applicator unit 15 and a pedestal 34 (refer also to FIG. 5) of the chip locating unit 30 are aligned to a common centerline 33. Furthermore, the position of the adhesive applicator unit 15 and that of the chip locating unit 30 remain stationary with respect to a common frame structure or base 35 during the normal operation of the apparatus 11. The tape transport and alignment unit 20, on the other hand, reciprocates with respect to the base 35 between the applicator unit 15 and the chip locating unit 30. The reciprocating movement of the wheel 39 moves two sites 13 on diametrically opposite locations of the wheel 39 along a reference axis which is coincident with the centerline 33.

During each cycle of operation, the reciprocation of the tape transport and alignment unit 20 moves one of the sites 13 on the tape 14 into contact with the applicator 32. As the site 13 contacts the applicator 32, adhesive is deposited on the site. During the continuation of the same cycle, the alignment unit 20 reciprocates away from the applicator 32 and toward the chip locating unit 30. Moving another site 13 on the tape 14, one to which adhesive has already been applied, into contact with one of the chips 12 located on the pedestal 34, the chip is transferred to the site 13 of the tape 14. Since the chip is being transferred from the pedestal 34 to the site 13, the location of the pedestal 34 in the apparatus 11 is also referred to as a load station.

Each such site 13 of the tape 14 remains engaged on an index wheel 39 of the tape transport and alignment unit 20 while it is indexed between the adhesive applicator unit 15 and the chip locating unit 30. Once having become engaged by the index wheel 39, the tape 14 does not become disengaged from the index wheel 39 until after the tape has advanced past the chip locating unit 20, and the chips 12 have been loaded onto the respective sites 13.

The engagement and disengagement of the tape 14 from the wheel 39 is brought about, one site 13 at a time, by indexing the wheel 39. For each increment of the tape 14 which becomes disengaged from the wheel 39 with one of the chips 12 loaded onto one of the sites 13, a new increment of the tape engages the wheel 39 and a new one of the sites 13 becomes aligned with the applicator 32.

The continued engagement of the tape 14 by the index wheel 39, and the capability to adjust both, the adhesive applicator 32 and the pedestal 34, to the common centerline 33 permit the adhesive and the chips 12 to be applied to respective sites 13 with a high degree of repetitive accuracy with respect to the sites and consequently, with respect to each other.

THE ADHESIVE APPLICATOR UNIT 15

Figure 3:
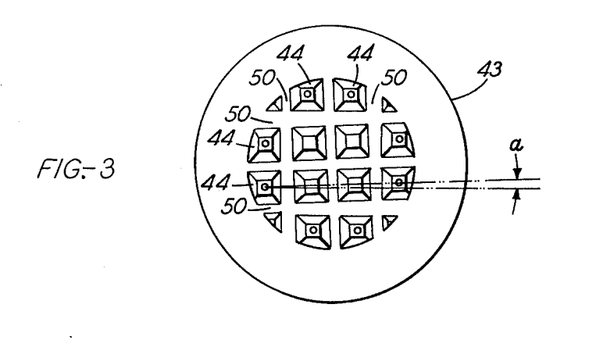
FIG. 3 is an end view of an applicator of the adhesive dots, showing an offset pattern of applicator tips.

The adhesive applicator unit 15 is best explained in reference to FIGS. 1, 2 and 3. The applicator 32 includes a reservoir 42 which holds a supply of liquid adhesive resin. A lower end 43 of the applicator 32 terminates in a plurality of centrally located applicator tips 44.

Referring to FIG. 2, there is shown a portion of the tape 14 including a typical site 13 to which a chip 12 has been loaded. The site 13 includes a peripheral embossment 46 and a central aperture 47. When the adhesive applicator 32 contacts the tape 14, a plurality of dots 48, each issuing from one of the tips 44, are deposited on the surface of the peripheral embossment 46 of the site 13. The positions of the dots 48 on the peripheral embossment 46 are chosen to correspond to intended positions of selected leads 49 of the chip 12 when such chip is deposited on the site 13.

Not all chips manufactured in the industry are of the same size. A small variation in the size of the chip can be tolerated by the aperture 47 in the tape 14. In general, it is advantageous to select the size of the aperture 47 in the tape in relation to the size of the chip 12 which is to be loaded onto the site. Also, depending on the size of the chip 12 and the number of beams extending from each of the four edges of the chip 12, one or more adhesive dots 48 may be applied along each edge of the peripheral embossment 46 at the site 13. Loading of the chip 12 to the site 13 suspends the chip in the aperture 47 while a portion of the beams 49 extend onto the peripheral embossment 46.

Required skewing of the applicator tips 44 to cause the adhesive dots 48 to be coincident with the offset beam leads 49 is achieved in a manner similar to that described in U.S. Pat. No. 3,785,903 to Boyer et al. However, in the Boyer et al. patent only a single dot 48 of adhesive is disclosed as being deposited along each edge of the aperture 47. FIG. 3 depicts an end view of the lower end 43 of the applicator with an arrangement of eight such applicator tips 44 located in a square pattern. Each pair of tips 44 is skewed by an angle $a$ with respect to the orthogonal direction of the pattern. Machined grooves 50 extend in the orthogonal and in the skewed direction to form the tips 44. The preferred hole size of the aperture in each applicator tip 44 is approximately 0.0024 inch. The flat end portion of each tip 44 is approximately 0.004 inch square.

A machined flat 51 on a flange 52 determines the angular orientation of the applicator 32 to locate each tip 44 coincident with a desired position of one of the adhesive dots 48 on the peripheral embossment 46. The lower end 43 of the applicator 32 is preferably cylindrical. The end 43 fits slidably through a corresponding aperture in a mounting bracket 53, thereby permitting a vertical movement of the applicator 32 along the centerline 33. During such movement, the flat 51 slides along a vertical ledge 54 of the mounting bracket 53 to maintain the orientation of the applicator 32 with respect to the bracket 53.

Full contact of the applicator tips 44 with the respective site on the tape 14 is assured by the extent of the vertical movement of the index wheel 39. The vertical excursion of the wheel 39 is chosen to lift the applicator 32 slightly. The flange 52 consequently separates from a bearing surface 55 of the mounting bracket 53, and the applicator 32 rests on the site 13 of the tape.

In contrast with the prior art apparatus described in the Boyer et al. patent, the position of the applicator 32 is precisely adjustable in a horizontal plane with respect to the stationary base 35 of the apparatus 11. A horizontal plate 57 supports a precision adjustment mechanism 58 including two adjustable slides 59 and 61 operating at right angles to each other. The positions of the slides 59 and 61 are adjusted by respective adjustment screws 62 and 63 to align the center of the applicator 32 with the common centerline 33. Setting of lock screws 64 and 65 prevents inadvertent further movement of the slides 59 and 61 to retain the applicator 32 in a desired, aligned position.

A desirable adhesive for holding the beam-lead chips 12 on the tape has been disclosed in the Boyer et al. patent. For instance, a silicone resin, available from Dow Corning Corporation, Midland, Mich., exhibits desirable characteristics. The material is available under the designation WE-648 or XR-62-047 Resin. It is sufficiently flowable to be used in the applicator. It is also sufficiently tacky after deposition on the tape 14 to hold the chips 12 in the tape.

THE CHIP LOCATING UNIT 30

Figure 4:
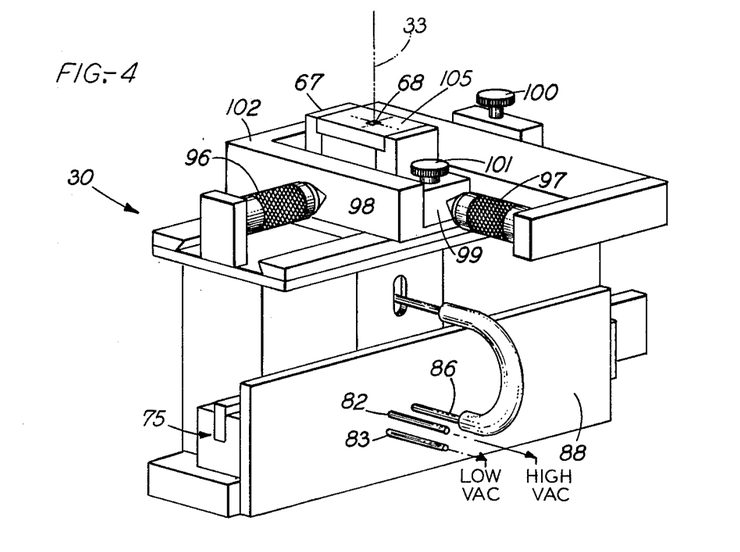
FIG. 4 shows the chip centering or chip locating unit of the apparatus of FIG. 1.
Figure 5:
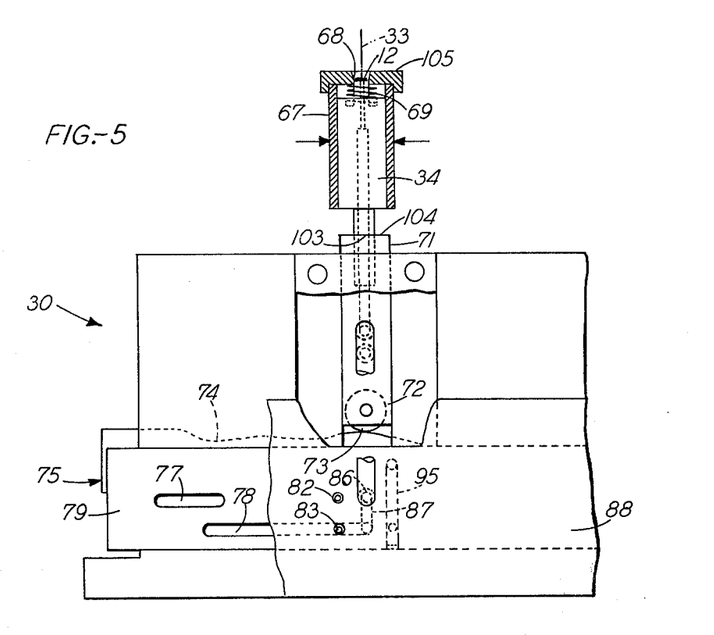
FIG. 5 shows portions of the mechanism of the chip locating unit of FIG. 4.

Referring to FIGS. 4 and 5, the chip locating unit 30 centers chips 12, one at a time, with respect to the centerline 33, and orients the chips so that their leads 49 become aligned with the tape 14 (see FIG. 1). The centering mechanism consists of a block 67 having a centering cavity 68 in the form of an inverted truncated pyramid in its top surface. The pedestal 34 is slidably mounted along the vertical axis of the cavity. The pedestal extends below the cavity and is biased downward by a spring 69 to rest against a plunger 71. A lower end 72 of the plunger has a cam follower surface which is preferably a rotatably mounted roller 73. The roller 73 rides against a contour 74 of a cam 75 which may be a rotary disc cam. For the present embodiment however, a linearly sliding cam is preferred.

Figure 6:
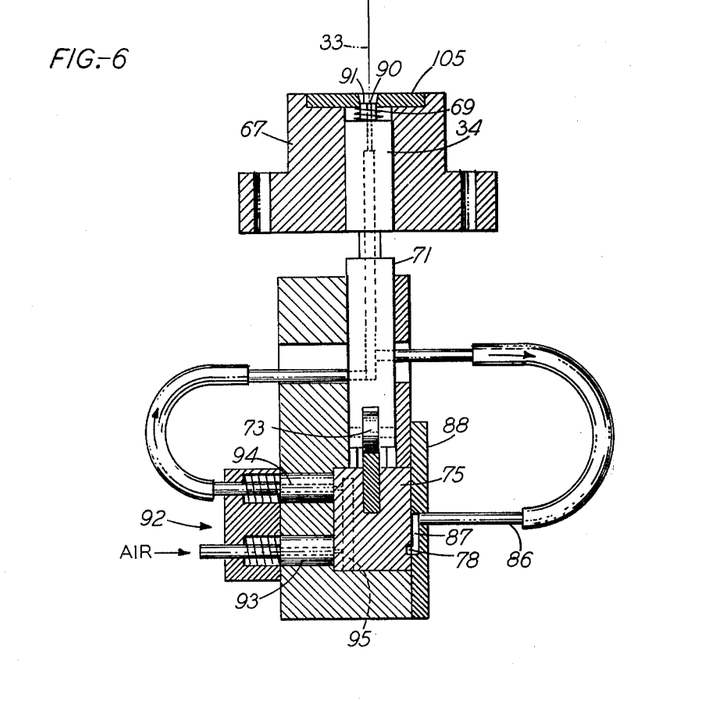
FIG. 6 is a section through a portion of the locating mechanism of FIG. 4.

Cavities such as the cavity 68 for centering beam-lead chips are known in the art. Reference is made to an application, Ser. No. 414,481 filed in the Patent and Trademark Office on Nov. 9, 1973 in the name of Hentz et al. and published under the Second Trial Voluntary Protest Program on Jan. 20, 1976, now U.S. Pat. No. 3,982,979 which is assigned to the assignee hereof. The referred-to Hentz et al. patent described advantages of moving the equivalent of the pedestal 34 up and down in an oscillating motion superimposed on the general downward motion of the pedestal 34 which occurs during the centering operation, to intermittently engage the device or chip 12 as it is lowered into the cavity 68. The publication also refers to the advantage of applying a slight vacuum to the pedestal. In the past, a selective application of vacuum to a centering device had been controlled by activating and deactivating solenoid-controlled valves. Referring to FIGS. 5 and 6, the sliding cam 75 includes a high vacuum passage 77 and a low vacuum passage 78 in a vertical side face 79 of the cam 75. As the cam 75 moves to raise and lower the pedestal 34, the passages 77 and 78 selectively bridge a gap from a tube 82 and from a tube 83, respectively, to an intake port 86 of a fluid passage to the pedestal 34. The intake port 86 includes a vertical passage 87 in a sideplate 88 as shown in the sectioned view of the sideplate 88 in FIG. 6.

A relatively high vacuum source of preferably 10 inches of mercury is connected to the tube 82 while a low vacuum source of preferably 5 inches of mercury is connected to the tube 83. Therefore, as the cam 75 is linearly displaced past the tubes and the plunger 71, the pedestal 34 reciprocates vertically up and down in a predetermined pattern of motion while the low vacuum and the high vacuum sources connected to the tubes 82 and 83, respectively, are selectively switched to draw air through a fluid port or opening 90 in a platform 91 of the pedestal 34. Consequently, the cam 75, as a single moving element, directly controls the movement of the pedestal 34 and the application of either a high or a low vacuum to the pedestal 34. The cooperation of both the vertical movement of the pedestal 34 and the force on the chip by the vacuum results in the alignment of the chip 12 located on the pedestal to the centerline 33.

The cam 75 also controls an air purge of the centering cavity 68 which is activated at the end of each centering operation, namely, when the centered chip 12 has been transferred to the tape 14. Referring to FIG. 6, the air purge is controlled by an air valve 92 which is integrated into the cam 75. An air supply tube 93 is spring loaded toward and terminates against the cam. An air connection 94 is also spring loaded against and terminates at the same flat surface of the cam 75. The air connection is coupled directly to the vacuum passage leading to the pedestal 34. When the cavity 68 is to be purged at the end of the centering operation, the cam 75 has moved to a position where both the low vacuum and the high vacuum sources are deactivated. In that position of the cam, a passage 95 in the body of the cam couples the air supply tube 93 to the air connection 94. The resulting air purge through the pedestal 34 and the cavity 68 is intended to clear any debris or other particles from the cavity 68. Remaining particulate matter could jam the cavity to prevent the subsequent chip 12 from becoming properly centered during the next operational cycle of the apparatus 11.

To initially establish precise positioning of the chips 12 with respect to the centerline 33 of the apparatus 11, orthogonally arranged adjustment screws 96 and 97, shown in FIG. 4, move respective slides 98 and 99 to center the cavity 68 on the centerline 33. Two lock screws 100 and 101 are preferably tightened after the slides 98 and 99 have been adjusted to prevent undesirable shifting of the adjusted position of the slides during the operation of the apparatus 11. The slides 98 supports a frame structure 102 for the block 67.

Referring to FIG. 5, the block 67 and the pedestal 34 are laterally movable with respect to the plunger 71 without affecting the precise vertical orientation of the pedestal 34 in the cavity 68. When an adjustment of the block 67 with respect to the centerline 33 is made, a bottom flat surface 103 of the pedestal 34 simply slides laterally with respect to a mating flat surface 104 on the top of the plunger 71. It should be realized however, that such adjustments to align the cavity 68 to the centerline 33 are precision adjustments only with very small lateral excursions. Vacuum passages between the pedestal 34 and the plunger 71 are consequently not adversely affected by such small lateral displacements of the pedestal 34 with respect to the plunger 71.

When one of the chips 12 is received on the pedestal 34 and aligned by the cavity 68 during the operational cycle of the locating unit 30, the alignment includes centering the chip 12 to the centerline 33, as well as orienting the chip by rotating it through an angle in the order of five degrees or less to align it to the direction of the tape. At the end of the centering operation, the chip is held by the high vacuum to the pedestal 34 and lifted to a load or transfer position above a top surface 105 of the block 67. Upon reaching the transfer position the vacuum in the pedestal 34 is turned off by the cam 75 to permit a transfer of the chip 12 to the site 13 on the tape. After the chip 12 is transferred to the tape, the pedestal 34 returns to the bottom of the cavity 68 and their purge clears the cavity of any remaining foreign matter before the next chip 12 is received on the pedestal 34 from the chip supply unit 25.

THE CHIP SUPPLY UNIT 25

Referring to FIG. 1, the chip supply unit 25 is substantially a commercial chip sorting apparatus. Such an apparatus is available, for instance, by Teledyne Tac, Inc. under the tradename of "Minisorter." Basically, it comprises an indexable chip supply table 106 and a transfer arm 107 which is capable of both vertical and angular motion about a pivotal axis to advance a pickup tip 108 between a pickup position above the table 106 and a deposit position above the pedestal 34. The pickup tip 108 is connected to a vacuum source which is selectively operated to pick up the chip 12 at the table 106, to hold the chip 12 during its transfer to the pedestal 34, and to release it as it is deposited at the pedestal 34. The pickup tip 108 is a tube having a flat end. The tubular opening in the end is coupled to the customary vacuum source (not shown) which produces the necessary suction to securely hold the chip during its transfer to the locating unit.

THE TAPE TRANSPORT AND ALIGNMENT UNIT 20

The function of the tape transport and alignment unit 20 is to handle the tape 14 for the chip loading operation. The unit 20 incrementally advances the tape 14 to align the sites 13 first with the adhesive applicator 32 and then with the pedestal 34 of the chip locating unit 30. In addition to aligning the sites 13, the unit 20 reciprocates to move the aligned sites 13 first into contact with the adhesive applicator 32, and then into contact with the chip 12 on the pedestal 34. The motion of the unit 20 is consequently used to apply the adhesive and to load the chips 12 to the sites 13.

The unit 20 is supported by a frame which is designated generally by the numeral 121. The frame includes a vertical base plate 122 which supports the index wheel 39 and its drive, a special indexing drive 123 frequently referred to as a Genveva drive. The drive 123 comprises a revolving drive pin 126, which on each revolution engages one of a number of equally spaced drive slots 127 in the index wheel 39. The location of the center of revolution of the drive pin 126 in the baseplate 122 is chosen with respect to the index wheel 39 for the pin 126 to first engage and then disengage the respective slot 127 in a radial direction away from the center of the index wheel 39. The resulting motion of each indexing step of the wheel 39 is substantially sinusoidal. When the pin 126 first engages one of the respective slots 127, there is no initial angular velocity of the wheel 39. The drive 123 further includes a cam (not shown) which lifts a detent pin 131 from one of a number of detent slots 132. The slots 132 are equally spaced about the periphery of the index wheel 39 in an alternate arrangement with the slots 127. The detent pin 131 is lifted from the respective detent slot 132 when the drive pin 126 first engages one of the slots 127. Just before the pin 126 revolves out of engagement with the slot 127 at the conclusion of the index step, the detent pin re-engages the next detent slot 132. The alternate engagement of the detent pin 131 and the drive pin 126 with the index wheeel 39 provides a continuous positive control over the position of the index wheel 39. The detent slots 132 are precision ground, such that the engagement of the pin 131 with one of the slots 132 precisely locates the angular rest position of the index wheel 39.

Figure 7:
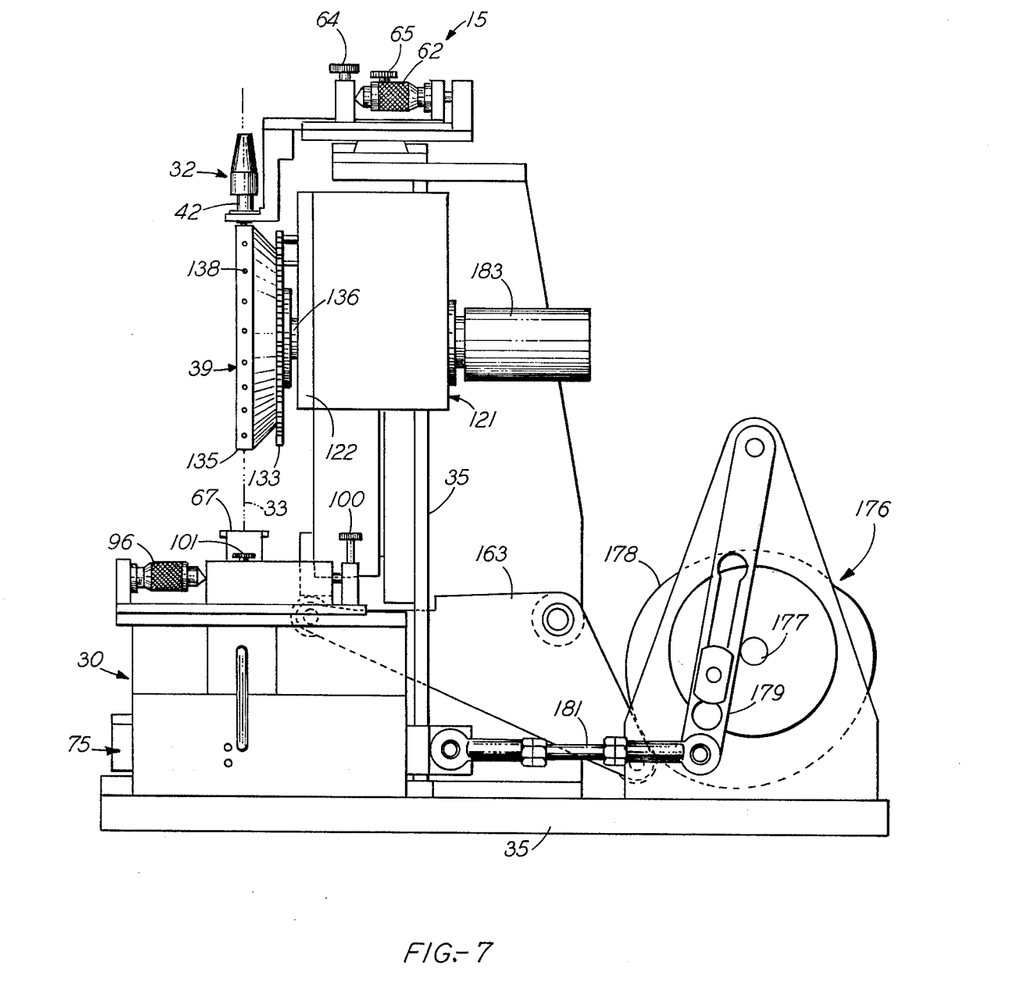
FIG. 7 is a side view of the apparatus of FIG. 1.

The index wheel 39 itself is a composite of machine elements which are best described in reference to FIGS. 1 and 7. An index rim 133 has the drive slots 127 and the detent slots 132 evenly spaced about its periphery. The index rim 133 is mounted to a sprocket wheel 135 which mounts onto a shaft assembly 136. The shaft assembly 136 is rotatably supported in the base plate 122 to accurately locate the index wheel 39 as a whole with respect to the base plate 122. The index rim 133 mounts concentrically onto the sprocket wheel 135; however, the angular position of the index rim 133 may be shifted with respect to the angualar position of the sprocket wheel 135. The sprocket wheel 135 has circumferentially spaced sprocket teeth 138 which correspond to spaced guide apertures or guide holes 139 of the tape 14 as shown in FIG. 2. The sites 13 are symmetrically spaced between the guide holes 139. When the angular position of the index rim 133 is shifted, the tape 14 in engagement with the sprocket wheel 135 is advanced or retarded with respect to the detent position of the index rim 133. Once a desired angualar position between the index rim 133 and the sprocket wheel 135 is established, the position of the index rim 133 is locked with respect to the sprocket wheel 135 by fastening screws 140 shown in FIG. 1.

A length of the compliant tape 14 is unreeled from a supply reel 141 and routed across a number of guide rollers 142 onto the index wheel 39. Additional guide rollers 143 insure full engagement of the tape 14 with the index wheel 39 past a position in alignment with the counterline 33 adjacent the pedestal 34. The guide rollers 142 and 143 form an assembly 144, the rollers being mounted to a common backing plate 146. The backing plate 146, in turn, is attached to the base plate 122. Guided past the rollers 143, the tape 14 is reeled onto a take-up reel 148.

The supply reel 141 and the take-up reel 148 are rotatably mounted in the base plate 122. Also, both the supply reel 141 and the take-up reel 148 are subjected to a torque. The torque as applied to the supply reel 141 opposes unreeling of the tape from the supply reel 141 to keep tension on the tape as it is being advanced by the index wheel 39. On the take-up reel 148 the torque initiates the necessary motion to wind the tape onto the take-up reel as the tape becomes disengaged from the index wheel 39.

To maintain accuracy in the positioning of the index wheel 39, a drive 150 including a motor 151 and respective torque clutches 152, 153 on each of the reels is shut off when the forward motion of the index wheel 39 ceases but prior to the disengagement of the pin 126 with the slot 127. At that time, the two sites 13 on the tape 14 have become positioned adjacent the applicator 32 and the pedestal 34, respectively. Even though the torque drive 150 is shut off it is still desirable to maintain under tension a portion 154 of the tape between the index wheel 39 and the take-up reel 148. Consequently, a one-way clutch 155 is engaged with the take-up reel 148 to prevent the take-up reel 148 from releasing the tension of the tape once the torque drive 150 is deactivated. During each operational cycle, the entire tape transport and alignment unit 20 reciprocates vertically. The unit 20 first advances toward the adhesive applicator 32 and then toward the pedestal 34. To facilitate the reciprocating movement the frame structure 121 is mounted directly to the movable slide portion 160 of a precision slide 161. The fixed portion 162 of the slide 161 is mounted to the base 35 of the apparatus 11.

Reciprocation of the unit 20 to effect a contact between one of the aligned sites 13 of the tape 14 and the tips 44 of the applicator 32, and to move the other aligned site 13 into contact with the chip 12 on the pedestal 34 occurs when the index wheel 39 is securely detented. Reciprocation of the unit 20 moves both aligned sites 13 along the centerline 33. To effect the reciprocating motion, the unit 20 rests on a pivotably mounted cam lever 163 (shown in FIG. 7) which raises and lowers the entire unit 20 including the movable portion of the slide 161. On its downward motion, the unit 20 remains in contact with the surface of the cam lever 163 which controls the motion of the unit 20 until the unit 20 comes to rest against an adjustable stop 166 (shown in FIG. 1). A precise adjustment of the stop 166 determines the lowest excursion of the unit 20 and, consequently, establishes the extent of engagement between the beam leads 49 of the chip 12 and the adhesive dots 48 located on the peripheral embossment of the respective site 13. An insufficient downward excursion of the index wheel 39 toward the chip 12 to be loaded may prevent a proper placement of the chip on the tape 14. On the other hand, an excessive excursion of the index wheel 39 toward the chip 12 might cause the beam leads 49 to be excessively deformed or damaged during the loading operation. A precise adjustment of the stop 166 is therefore important to the proper operation of the apparatus 11. Advantageously, a proper adjustment of the stop 166 is, therefore, made prior to the continuous operation of the apparatus 11.

To facilitate an adjustment of the stop 166, and also of the adjustment of the adhesive applicator 32 and the chip locating unit 30 with respect to the common centerline 33, two closed circuit television cameras are preferably mounted along axes 168 and 169 in the plane of rotation of the index wheel 39. The first camera, not shown, viewing the tape 14 along the axis 168, monitors the position of the adhesive dots in relation to the aperture 47 at each of the sites 13 in the tape. The second camera, not shown, viewing the tape 14 along the axis 169, monitors the position of the chip 12 within the aperture 47 of each of the sites.

In addition to monitoring the position of the chip 12 within the aperture 47, the second camera views the beam leads 49 to establish whether or not the downward excursion of the unit 20 is sufficient. The image of the second camera provides a view of the amount of engagement of the beam leads 49 with the adhesive dots 48. The vertical position of the stop 166 may then be adjusted accordingly to obtain an optimum lowermost excursion of the unit 20.

THE TIMING SEQUENCE

Figure 8:
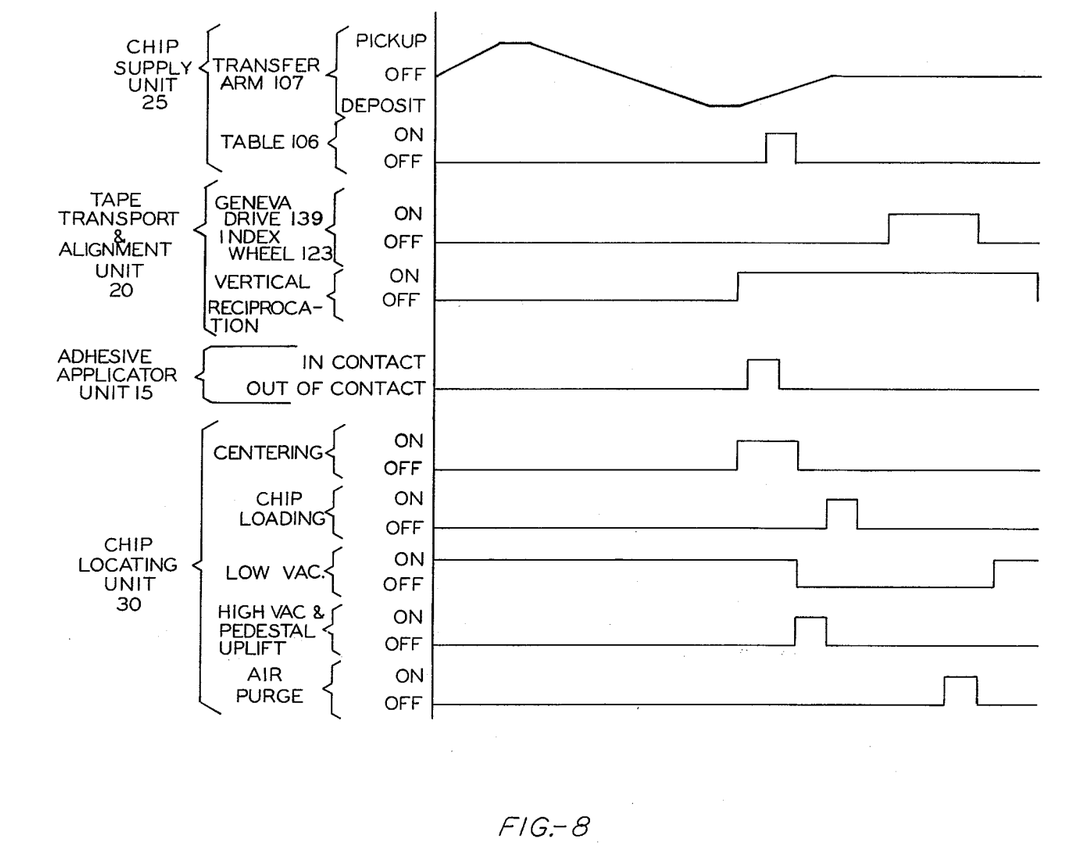
FIG. 8 is a timing diagram of a preferred working sequence of the apparatus of the present invention.

Referring now to the timing diagram of FIG. 8, a cycle of operation is initiated by the chip supply unit 25. The chip transfer arm 107 moves initially from an "off" or rest position to the pickup position above the table 106. A chip is then transferred from the table 106 to the pedestal 34. As the chip is deposited on the pedestal 34 for centering, the chip locating unit 30 and the tape transport and alignment unit 20 are triggered.

Referring briefly to FIG. 7, the cam 75 of the locating unit 30 and the cam lever 163 are both driven by a power assembly 176 which includes a shaft 177 mounted for rotation, a cam 178 to pivot the lever 163, and a slider crank mechanism 179 which imparts reciprocating motion through a connecting link 181 to the cam 75. The completion of a revolution of the assembly 176 completes an operational cycle of the apparatus 11.

The index wheel 39 moves the site 13 into contact with the applicator 32 in the very beginning after the unit 20 starts its vertical reciprocation. As the unit 20 reciprocates, the chip 12 is also being aligned to the centerline 33. The alignment of the chip 12 extends in time beyond the application of the adhesive to the site 13. Also during the alignment of the chip 12, the table 106 is indexed to present the next chip 12 to the transfer arm 107 for pickup at the beginning of the next cycle.

At the end of the alignment operation, the normally present low vacuum is switched to a high vacuum as the pedestal 34 is raised toward the transfer position above the surface of the block 67. In the meantime, the unit 20 has reciprocated away from the applicator unit 15 and toward the pedestal 34. During the loading of the chip 12 to the site 13 the high vacuum is turned off.

After completion of the chip-loading contact with the pedestal 34, the unit reciprocates toward a neutral position near the applicator 32. During the movement toward the neutral position, a motor 183 is energized to operate the Geneva drive 123 and advance the index wheel 39 by one increment. Simultaneously with the indexing of the wheel 39, the cam 75 reaches a position where the air purge clears the cavity 68. Prior to the completion of the operational cycle, the cam 75 returns to a neutral position. Before reaching the neutral position the air purge is turned off and shortly thereafter the low vacuum is again applied to the pedestal 34 in preparation for the next cycle.

Although the invention has been described herein with respect to a certain preferred embodiment as shown in the drawing, it is to be understood that the invention is not limited thereto. Modifications, additions and deletions are possible without departing from the spirit and scope of the invention.

What is claimed is:

1. A method of loading an article onto a site on a carrier tape which comprises:
   engaging a portion of the tape including the site with a locating means;
   moving the site against an adhesive applicator to apply adhesive to predetermined areas of the site;
   maintaining the engagement of the portion of the tape with the locating means while indexing the site into vertical alignment with an article; and then
   moving the adhesive-applied site toward and against the article without releasing the engagement of the portion of the tape from the locating means until after the article has been loaded to the site by contact with the adhesive on the site.

2. In a method of attaching articles to sequentially occuring sites on a tape, wherein the tape is incrementally advanced past an adhesive applicator station and then past a load station, and wherein adhesive is applied to the sites at the applicator station and the articles are contacted in sequence to the adhesive at the respective sites at the load station to attach the articles to the sites, the improvement comprising:
   engaging successive portions of the tape including successive sites with an alignment member;
   advancing the alignment member along with the portions of the tape in engagement with the alignment member, incrementally past the applicator station and past the load station;
   moving the alignment member between such incremental advances toward and away from the applicator station and the load station, to contact one of the sites to the applicator for applying adhesive to the site and to contact another one of the sites to one of the articles at the load station to attach the article to the site; and releasing the successive portions of the tape from engagement with the alignment member after the articles have become attached to the sites on such portions.

3. A method according to claim 2, wherein each of the articles is aligned to a reference axis at the load station prior to attaching such articles to a respective site.

4. A method according to claim 3, wherein the successive portions of the tape are engaged by an index wheel, and the index wheel reciprocates between the applicator station and the load station to contact the site to the applicator station prior to contacting the other site to the article at the load station.

5. A method according to claim 4, wherein aligning the article at the load station comprises:

transferring the article to a centering cavity located on the reference axis;

activating a cam member for opearting a pedestal to partially support the article being centered and for selectively providing through the cam a passage for a vacuum circuit to the pedestal to flow air past the article toward the pedestal during the centering of the article.

6. A method according to claim 5, wherein the articles are beam-lead chips and reciprocating the index wheel between the applicator station and the load station comprises contacting the site against a pattern of applicator tips of an adhesive applicator unit and then separating the site from the tips whereby a plurality of adhesive dots are deposited on the site, the location of the dots corresponding to the location of beam leads when the site is contacted to the beam-lead device at the load station.

7. In a method of orienting an article wherein the article is placed on an upper surface of a pedestal extending along a vertical axis through a centering cavity, the pedestal being movable mounted to retract through a base of the cavity and having a central fluid duct with an aperture in the top surface, wherein the article is centered with respect to the vertical axis through the cavity and oriented to the orientation of the sides of the cavity by being lowered into the cavity while at least in part being supported by the pedestal as it retracts toward the base of the cavity, and while being subjected to an airflow from the top of the cavity into the aperture of the pedestal, an improvement which comprises:

moving a cam in a direction substantially perpendicular to the pedestal, the cam having a contoured surface in camming support of the pedestal to vary the vertical position of the pedestal;

exposing a flat surface adjacent the contoured surface of the cam to terminations of at least two ducts, the ducts being coupled to a vacuum source and to the fluid duct in the pedestal, respectively; and moving a vacuum passage in the face of the flat surface into alignment with the terminations of the two ducts to selectively couple the vacuum source to the aperture in the pedestal, whereby airflow into the aperture and a resulting vacuum pull on the article is correlated to precise vertical positions of the pedestal while the article is being oriented.

8. An improved method as set forth in claim 7, wherein the pedestal is also lifted by cam above a top opening of the cavity after the article has been centered, comprising:

moving the vacuum passage out of alignment with the two terminations prior to lifting the pedestal; and aligning a second vacuum passage to a third termination of a third duct and to the duct coupled to the fluid duct in the pedestal, the third duct being coupled to a second vacuum source producing a vacuum of different magnitude, whereby a vacuum pull of different magnitude from that resulting during centering of the article is generated to hold the article in a centered position while it is lifted by the pedestal.

9. An apparatus for loading a plurality of articles onto consecutively located sites on a carrier tape, which comprises:

a wheel having a plurality of index positions equally spaced about its periphery and having means for locating the tape in contact with the wheel and for locating the sites of the tape to coincide with the index position;

an adhesive applicator located in the plane of the wheel adjacent one of the index positions;

means for aligning one of the articles in a desired orientation with respect to one of the sites of the tape at an index position advanced from the positon adjacent the applicator;

means for moving the wheel in a plane perpendicular to its axis alternately toward the applicator and then toward the article aligning means, to apply adhesive to the respective site and then to load the aligned article onto the adhesive-applied site of the tape; and means for indexing the wheel to advance new sites into position adjacent the applicator and the article aligning means for a subsequent operation.

10. An apparatus according to claim 9, wherein the applicator is located on a common centerline with the article aligning means, and the wheel moving means comprises a means for linearly reciprocating the wheel between the applicator and the article aligning means.

11. An apparatus according to claim 10 wherein the article aligning means comprises:

means for centering the article to the common centerline and for orienting the article in a plane perpendicular to the common centerline, including a reciprocable plunger having a platform for supporting the article, and a fluid port in the platform; and means for reciprocating the plunger, said means including at least one fluid passage positioned to selectively couple the fluid port of the plunger to a fluid circuit in response to a relative movement between the plunger reciprocating means and the plunger.

12. An apparatus for orienting an article with respect to a vertical reference axis, which comprises:

a frame structure locating a centering cavity on the reference axis;

a pedestal movably mounted on reciprocate vertically along the reference axis through the cavity to support the article being centered therein;

a fluid duct being located in the pedestal;

a cam movably mounted and coupled to the pedestal to impart the reciprocating motion to the pedestal;

means, mounted on the frame structure for laterally contacting the cam, said contacting means including at least two fluid duct terminations connected to at least a vacuum source and to the fluid duct of the pedestal; and means located fixedly in the body of the cam for conducting fluid between the terminations upon the cam locating the pedestal in predetermined positions during the centering of the article.

13. An apparatus according to claim 12 wherein the terminations include two terminations each of which is coupled to a separate vacuum source of different magnitude, and the fluid conducting means in the cam comprises at least two separate and distinct ducts, each duct coupling one of the terminations coupled to one of the vacuum sources to the fluid duct in the pedestal.

14. An apparatus according to claim 13, which further comprises two air terminations, each air termination extending through the cam contacting means against a lateral surface of the cam, each air termination being resiliently urged against the lateral surface of the cam, the cam including an internal fluid passage to interconnect the two terminations during a desirable instant when the cam reaches a predetermined position, one air termination being coupled to an air supply and the other being coupled to the fluid duct in the pedestal, whereby the cavity becomes cleared of undesirable debris.

15. An apparatus according to claim 14 wherein the lateral surface being contacted by the cam is located opposite a second lateral surface, and the fluid conducting means coupling the vacuum are groove-like passages located in the second lateral surface.

16. An apparatus according to claim 15, wherein the cam is a linearly slidable cam.

* * * * *

UNITED STATES PATENT OFFICE
CERTIFICATE OF CORRECTION

Patent No. 4,029,536          Dated June 14, 1977

Inventor(s) Ernest Kovacs et al.

It is certified that error appears in the above-identified patent and that said Letters Patent are hereby corrected as shown below:

```
Col. 6, line 31, "slides" should be --slide--;
        line 61, "their" should be --the air--.
Col. 7, line 57, "wheeel" should be --wheel--.
Col. 8, line 25, "counterline" should be --centerline--.
Claim 2, line 51, "occuring" should be --occurring--;
         line 67, after "applicator" insert --station--.
Claim 7, line 40, "movable" should be --movably--.
Claim 8, line 68 after "by" insert --the--.
Claim 9, line 21 "position" should be --positions--.
Claim 12, line 60, "on" should be --to--.
          line 66, "on" should be --to--.
```

Signed and Sealed this

Eleventh Day of October 1977

[SEAL]

Attest:

RUTH C. MASON          LUTRELLE F. PARKER
Attesting Officer      Acting Commissioner of Patents and Trademarks